(12) United States Patent
Kaouk et al.

(10) Patent No.: US 12,611,834 B2
(45) Date of Patent: Apr. 28, 2026

(54) PRESSING TOOL AND METHOD FOR PRODUCING A PRESS PLATE

(71) Applicant: HUECK Rheinische GmbH, Viersen (DE)

(72) Inventors: Ali Kaouk, Viersen (DE); Thorsten Hagedorn, Krefeld (DE); Berthold Thölen, Viersen (DE)

(73) Assignee: HUECK Rheinische GmbH, Viersen (DE)

( * ) Notice: Subject to any disclaimer, the term of this patent is extended or adjusted under 35 U.S.C. 154(b) by 280 days.

(21) Appl. No.: 18/571,933

(22) PCT Filed: Oct. 25, 2022

(86) PCT No.: PCT/EP2022/079757
§ 371 (c)(1),
(2) Date: Dec. 19, 2023

(87) PCT Pub. No.: WO2023/078731
PCT Pub. Date: May 11, 2023

(65) Prior Publication Data
US 2024/0278523 A1 Aug. 22, 2024

(30) Foreign Application Priority Data

Nov. 4, 2021 (DE) .......................... 102021128738.3
Sep. 30, 2022 (DE) .......................... 102022125374.0

(51) Int. Cl.
B30B 15/06 (2006.01)
B44B 5/00 (2006.01)
(Continued)

(52) U.S. Cl.
CPC ............ B30B 15/062 (2013.01); B44B 5/026 (2013.01); C23C 14/042 (2013.01);
(Continued)

(58) Field of Classification Search
CPC ....... B30B 15/062; B30B 3/005; B30B 15/06; B30B 5/04; B44B 5/0052; B44B 5/02;
(Continued)

(56) References Cited

U.S. PATENT DOCUMENTS

| | | |
|---|---|---|
| 6,190,514 B1 | 2/2001 | Ma et al. |
| 2013/0299454 A1 | 11/2013 | Marxen et al. |

(Continued)

FOREIGN PATENT DOCUMENTS

| | | |
|---|---|---|
| AT | 407534 B | 4/2001 |
| AU | 1549199 A | 9/1999 |

(Continued)

OTHER PUBLICATIONS

Translation of WO-03016034.*

(Continued)

*Primary Examiner* — Bobby Yeonjin Kim
(74) *Attorney, Agent, or Firm* — Miller Nash LLP

(57) ABSTRACT

A pressing tool for producing a workpiece having a pressing surface. The pressing tool comprises a base structure and at least two ceramic layers which are arranged on the surface and form the pressing surface, of which a first ceramic layer has a first degree of gloss, and a second ceramic layer has a second degree of gloss, which differs from the first degree of gloss of the first ceramic layer.

20 Claims, 5 Drawing Sheets

(51) Int. Cl.

| | | |
|---|---|---|
| *B44B 5/02* | (2006.01) | |
| *C23C 14/04* | (2006.01) | |
| *C23C 14/06* | (2006.01) | |
| *C23C 14/35* | (2006.01) | |
| *C23C 14/56* | (2006.01) | |

(52) U.S. Cl.
CPC ............ *C23C 14/067* (2013.01); *C23C 14/35* (2013.01); *C23C 14/566* (2013.01)

(58) Field of Classification Search
CPC ..... B44B 5/026; C23C 14/042; C23C 14/067; C23C 14/35
See application file for complete search history.

(56) References Cited

U.S. PATENT DOCUMENTS

| | | |
|---|---|---|
| 2016/0193866 A1 | 7/2016 | Stoffel et al. |
| 2017/0226630 A1 | 8/2017 | Ma |

FOREIGN PATENT DOCUMENTS

| | | | |
|---|---|---|---|
| CH | 681083 A5 | 1/1993 | |
| CN | 1230604 A | 10/1999 | |
| CN | 103659954 A | 3/2014 | |
| CN | 110344093 A | 10/2019 | |
| DE | 102019127659 A1 | 4/2021 | |
| EP | 0470359 A2 | 2/1992 | |
| EP | 1063085 A1 | 12/2000 | |
| EP | 1184480 A2 | 3/2002 | |
| EP | 2497650 A1 | 9/2012 | |
| JP | S63203222 A | 8/1988 | |
| JP | H11314237 A | 11/1999 | |
| JP | 2000192635 A | 7/2000 | |
| JP | 2006116607 A | 5/2006 | |
| JP | 2008189956 A | 8/2008 | |
| JP | 2011503357 A | 1/2011 | |
| JP | 2014012615 A | 1/2014 | |
| JP | 2014504965 A | 2/2014 | |
| JP | 2015519217 A | 7/2015 | |
| JP | 2016530397 A | 9/2016 | |
| JP | 2016538162 A | 12/2016 | |
| JP | 2017104901 A | 6/2017 | |
| RU | 2133199 C1 | 7/1999 | |
| RU | 2726133 C2 | 7/2020 | |
| WO | WO-03016034 A1 * | 2/2003 | ........... B30B 15/062 |
| WO | WO-2009062488 A2 * | 5/2009 | ........ C23C 18/1605 |
| WO | WO-2012119586 A1 * | 9/2012 | ................ C25F 3/16 |
| WO | 2021074064 A1 | 4/2021 | |

OTHER PUBLICATIONS

Translation of WO-2009062488.*
Translation of WO-2012119586.*
European Patent Office. International Search Report and Written Opinion of the International Searching Authority in Application No. PCT/EP2022/079756, mailed Feb. 23, 2023, 15 pages.
European Patent Office. International Search Report and Written Opinion of the International Searching Authority in Application No. PCT/EP2022/079757, mailed Feb. 22, 2023, 18 pages.
Kaouk. U.S. Appl. No. 18/571,928, the U.S. National Phase of International Patent Application No. PCT/EP2022/079756, filed Oct. 25, 2022, 35 pages.

* cited by examiner

PRESSING TOOL AND METHOD FOR PRODUCING A PRESS PLATE

RELATED APPLICATIONS

This application is a national stage under 35 U.S.C. § 371 of International Application No. PCT/EP2022/079757, filed Oct. 25, 2022, which claims priority of German Patent Application No. 10 2021 128 738.3, filed Nov. 4, 2021, and German Patent Application No. 10 2022 125 374.0, filed Sep. 30, 2022.

TECHNICAL FIELD

The field of the disclosure relates to a pressing tool with a pressing surface and a method for producing a pressing tool.

BACKGROUND

Pressing tools, for example in the form of press plates, endless belts or embossing rollers are, in particular, used in the woodworking industry, for example to produce furniture, material boards such as laminates or panels, i.e. generally workpieces. The workpieces are pressed with the pressing surface of the pressing tool, such that the workpieces obtain surfaces corresponding to the pressing surface.

Material boards, for example wooden boards, are needed for the furniture industry and for interior construction, for example for laminate flooring. The material boards have a core made of MDF (medium-density fiberboard) or HDF (high-density fiberboard), onto which core various material layers are applied on at least one side, for example an (optical) decorative layer and a protective layer (overlay layer).

In order to avoid warpage in the material sheets produced, such material boards are generally provided with the same number of material supports on both sides; in order to join the individual layers of the material boards (core, material supports, etc.) together, they are pressed together in a press using special pressing tools, in particular press plates or endless belts. This also involves surface embossing of the material boards. Hot presses are usually used to bond the various material supports of thermoset resins, for example melamine resin, to the surface of the core under the action of heat by fusing the plastic materials.

In this process, the decorative layers determine the pattern and color design of the material board; a desired surface structure, on the other hand, can be achieved by using suitable pressing tools. For example, a wood or tile decor can be printed on the decor layer (decor paper), or decor layers with patterns and color designs are used that are artistically designed according to the intended use. Overlay layers printed on the top or bottom side can also be used in this regard.

In order to improve a true-to-nature reproduction, in particular in the case of material boards with a wood, tile or natural stone decor, the pressing tools are provided with a surface structuring which is designed to conform to be congruent with the decor layer and forms a negative image of the intended surface structure. For this reason, the pressing tools have a 3D profile (depth structuring) which is based, for example, on the wood grain of a wooden surface in order to give the decorative layer of the material board the appearance of such a wooden surface.

To achieve the congruent embossing of the material boards or the laminates—i.e. the required accuracy of fit of the decorative layer(s) and the structure of the pressing surface of the laminate—a high quality standard is required for the production of the pressing tools. In particular, the press plates or endless belts are used here as upper and lower tools in short-cycle presses, which are covered with press plates and preferably press pads, or in double-belt presses in the case of endless belts, wherein the embossing and heating of the material boards takes place simultaneously, so that the thermosetting resins of the decorative and/or overlay layers of the material boards are first melted, the surface structure corresponding to the structure of the pressing surface of the pressing tools is introduced into the outer material supports, and the structured material supports are bonded to the core of the material board by subsequent curing.

WO 2009/062488 A2 discloses a method for processing a structured pressing surface of an embossing tool. The surface is provided with a first chromium layer over the entire surface, on which at least one further chromium layer is arranged in predetermined areas. The degrees of gloss of the two chromium layers differ. By use of the pressing surface, a workpiece formed as a material board with a structured surface, which has different degrees of gloss, may be produced. Due to the use of the chrome layers and multiple masking and cleaning steps, the production of this pressing tool is relatively harmful to the environment.

U.S. Pat. No. 6,190,514 B1 discloses a method for producing a flat pressing surface to make a decorative laminate from resin-impregnated paper. This is accomplished by creating a desired finish on a planar pressing surface, removing impurities from the planar surface, and coating the planar surface with hafnium diboride, molybdenum diboride, tantalum diboride, titanium diboride, tungsten diboride, vanadium diboride, zirconium diboride, or mixtures of these substances in a surface magnetron sputter coating system to a Vickers hardness of at least 2000 HV, by moving the planar surface and a sputter head of the surface magnetron sputter coating system relative to each other at a scan speed sufficient to produce a thermal gradient of 27.78° C. or less in the planar pressing surface.

A need remains for a pressing tool with a pressing surface having different degrees of gloss in certain areas, the manufacture of which is relatively environmentally friendly.

A need also remains for a process for manufacturing a pressing tool that ensures easier reproducibility at lower cost.

A need also remains for a pressing tool for producing a workpiece, in particular a material board, with surface structuring including different structures, for example coarse and fine structures, with any desired degree of detail and quality.

SUMMARY

A pressing tool for producing a workpiece comprises a pressing surface, a base structure, and at least two ceramic layers which are arranged on top of one another on the surface and form the pressing surface, of which one of the ceramic layers is a full-surface ceramic layer with one degree of gloss and the other is a partial ceramic layer with a further degree of gloss which differs from the degree of gloss of the full-surface ceramic layer.

The pressing tool according to the present disclosure is, for example, an endless belt or an embossing roller. Preferably, the pressing tool is a press plate.

The pressing surface is, for example, smooth, but can also be configured as a structured pressing surface. In particular, the pressing surface may thus have a structure of protrusions and recesses, and the base structure may have a structured surface corresponding to the structure of the pressing surface or which pressing surface deviates in its 3-dimensional shape due to further application of layers, in particular ceramic layers.

Also disclosed is a method for producing the pressing tool according the present disclosure, comprising the following method steps:
- providing a support structure for a base structure,
- applying at least two base structure layers onto the support structure to build the base structure
- producing a structured surface on the support structure
- applying a first ceramic layer onto the surface of the base structure, and
- applying a second ceramic layer onto the structured surface and/or onto the applied first ceramic layer.

The pressing tool according to the present disclosure accordingly comprise the base structure, which, according to a variant, has a structured surface corresponding to the pressing surface optionally formed as a structured pressing surface. The base structure comprises, for example, multiple partial metal layers arranged one above the other, which form the surface of the base structure, as is known, for example, from WO 2009/062488 A2 mentioned in the introduction.

However, in order to obtain a relatively hard pressing surface, the surface of the base structure need not be provided with a chromium layer, but with the ceramic layers. Ceramics can also be configured to be relatively hard and can have, for example, a Vickers hardness of at least 2000 H V. Suitable ceramic materials of the ceramic layers are, for example, hafnium diboride, molybdenum diboride, tantalum diboride, titanium diboride, tungsten diboride, vanadium diboride, zirconium diboride or mixtures of these ceramic materials. The application and/or coating of the ceramic layers is significantly more environmentally friendly compared to the application and/or coating with the chromium layer.

Furthermore, the pressing tool according to the present disclosure can comprise at least two ceramic layers arranged one above the other comprising, preferably exactly two ceramic layers arranged one above the other. One of the ceramic layers is a partial ceramic layer and the other can be a full-surface ceramic layer. Since, according to the present disclosure, the degrees of gloss of the full-surface ceramic layer can differ from those of the partial ceramic layer, the pressing surface has different degrees of gloss in different areas, as a result of which the surface of the workpiece produced with the press plate can also have correspondingly different degrees can have gloss in certain areas. This can improve the quality of the workpieces produced by pressing with the pressing surface. Workpieces are, for example, material boards, in particular laminates or panels.

In particular, it is also possible to remove a worn or damaged ceramic layer from the base structure relatively easily in order to provide the base structure with new ceramic layers. This results in a relatively inexpensive repair of a worn or damaged pressing tool.

The ceramic layers can be applied, for example, using a surface magnetron sputter coating system.

The thicknesses of the two ceramic layers are preferably in the range between 1 μm and 2 μm.

In order to obtain the different degrees of gloss of the full-surface ceramic layer and the partial ceramic layer, the thickness of the full-surface ceramic layer is preferably different from the thickness of the partial ceramic layer. This is due to the fact that it is possible to adjust the degree of gloss of the corresponding ceramic layer by its thickness. In this case, the two ceramic layers preferably consist of the same ceramic material, which can have a positive effect on the manufacturing costs of the pressing tool according to present disclosure. The required thickness of the ceramic layers can be achieved during the manufacture of the press plate, for example, by suitably controlling the surface magnetron sputter coating system.

The degree of gloss of the two ceramic layers can also be adjusted by using different ceramic materials for the partial and full-surface ceramic layers. According to a variant of the press plate according to the present disclosure, the ceramic materials of the two ceramic layers can therefore differ in order to obtain the different degrees of gloss of the full-surface ceramic layer and the partial ceramic layer. In this case, in particular, the thickness of the full-surface ceramic layer is equal to the thickness of the partial ceramic layer.

Preferably, the partial ceramic layer is arranged between the full-surface ceramic layer and the surface of the base structure. This embodiment of the press plate according to the present disclosure can be produced, for example, by
- applying a partial mask onto the surface of the base structure,
- applying a ceramic layer onto the surface provided with the mask in areas not covered by the mask,
- removing the mask so that the partial ceramic layer is arranged on the structured surface, and
- applying the full-surface ceramic layer onto the partial ceramic layer.

However, the partial ceramic layer can also be produced, for example, by suitably controlling the surface magnetron sputter coating system.

Since, according to this variant of the pressing tool, the full-surface ceramic layer is applied onto the partial ceramic layer, a relatively smooth pressing surface can be produced in a relatively simple manner. In this case, however, the full-surface ceramic layer must be configured such that it does not completely cover the degree of gloss of the underlying partial ceramic layer. In particular, in this case, the full-surface ceramic layer is thinner than the partial ceramic layer, i.e. the thickness of the full-surface ceramic layer is smaller than the thickness of the partial ceramic layer.

However, the pressing tool according to the present disclosure can also be configured such that the full-surface ceramic layer is arranged between the partial ceramic layer and the structured surface of the base structure, i.e. that the partial ceramic layer is applied onto the full-surface ceramic layer. This embodiment of the pressing tool according to the present disclosure can be produced, for example, by
- applying the full-surface ceramic layer onto the surface of the base structure,
- applying a partial mask onto the full-surface ceramic layer,
- applying a ceramic layer onto the full-surface ceramic layer provided with the mask in areas not covered by the mask,
- removing the mask so that the partial ceramic layer is arranged on the full-surface ceramic layer.

However, the partial ceramic layer can also be produced, for example, by suitably controlling the surface magnetron sputter coating system.

The degrees of gloss of the partial and the full-surface ceramic layers can be achieved by a post-treatment of the corresponding applied ceramic layer to obtain a predetermined degree of gloss of the corresponding ceramic layer. A post-treatment may comprise, for example, a polishing or a laser treatment of the corresponding ceramic layer.

According to an embodiment of the pressing tool according to the present disclosure, the surface of the base structure may have different degrees of gloss in different areas, which differ in particular from the degrees of gloss of the full-surface ceramic layer and the partial ceramic layer. The adjustment of the different degrees of gloss of the surface of the base structure can be carried out, for example, by means of a laser or, in case of the base structure of multiple layers arranged one above the other, is known from WO 2009/062488 A2.

According to the present disclosure, the pressing tool can be used to produce a workpiece, in particular material boards for the furniture industry or for laminate flooring panels. The pressing tool has a pressing surface which is in direct contact with and faces the material board to be pressed when the material board is pressed in a press.

The pressing tool has a base structure with a surface. This surface can be flat or 3-dimensional. The surface can preferably be formed from a metallic surface, such as chromium, copper, stainless steel, nickel, tin or metallic alloys. Ceramic layers are arranged on this surface to form the pressing surface. A first ceramic layer has a first degree of gloss and a second ceramic layer has a second degree of gloss. A degree of gloss can be determined by material properties of the pressing surface, the layer structure, the surface structure of one or both ceramic layers or the underlying surface of the base structure. The first degree of gloss of the first ceramic layer is different from the second degree of gloss. This makes it possible to produce a particularly resistant surface which can nevertheless be configured in such a way that it realistically mimics a natural look, in particular a wood look.

Preferably, the pressing tool is a press plate for the production of material boards. Material boards are used in the furniture industry or for laminate flooring panels. The advantage of using a press plate is that it can be used in existing press plants in the furniture and flooring industry.

In a further exemplary embodiment, the base structure of the pressing tool can have a support structure made of metal, in particular stainless steel. A metallic support structure ensures uniform distribution of the pressing pressure on the material board to be pressed and is wear-resistant.

Preferably, it is possible for the pressing surface to have a structure of protrusions and recesses, and for the base structure to have a structured surface provided on the support structure, wherein at least two base structure layers, in particular made of metal, are provided on the support structure, which are arranged at least partially one above the other and form the structured surface of the base structure. These base structure layers can be applied flat or via an additive manufacturing process, in a 3-dimensional form. Additive manufacturing processes can be, for example, inkjet printing, 3-D printing, sintering, lithography, lacquering, printing with UV-curing ink or acrylate. In this regard, it is particularly advantageous that cheaper materials and faster and less precise application processes can be used for intermediate layers of the base structure layer. This enables more cost-effective production with a high surface quality at the pressing surface.

Furthermore, it can be useful if the first or second ceramic layer can also be applied only partially to the structured surface of the base structure and thus form a relief layer structure of the structured surface. This enables further fine structuring of the relief layer structure while at the same time increasing the resistance of the ceramic layers and/or achieving special optical effects.

In addition, it can be provided that the first ceramic layer and the second ceramic layer can, for example, each be applied only partially to the structured surface of the base structure. This enables further fine structuring of the relief layer structure while at the same time increasing the resistance of the ceramic layers and/or achieving special optical effects, for example different degrees of gloss or mattness in the partially applied areas.

In an advancement, the second ceramic layer can be arranged at least partially on the first ceramic layer. Hence, areas with different surfaces and different structures can emerge. Likewise, this can contribute to the formation of a relief layer structure.

Preferably, the first ceramic layer or the second ceramic layer can be processed by means of a laser at least in a laser processing area. Laser processing may be capable of producing a change in the degree of gloss, dullness, texture, or a cutout in an overlying layer on the pressing surface.

A clearance can be provided in the second ceramic layer, which, viewed in the direction of the base structure, extends to the first ceramic layer. When the pressing surface is viewed, this results in at least two differently appearing or differently structured areas.

Preferably, the clearance can be a cutout produced by subsequent processing of the applied second ceramic layer. Possible processing steps can include milling, laser irradiation, masking, masking with UV-curing ink and removal and/or etching or cracking by means of alkali or acid. For example, a sodium hydroxide solution containing hydrogen peroxide can be used for removal. These cutouts allow application over the entire surface and make it possible to make underlying layers visible or optically effective.

Furthermore, it can be useful if the subsequent processing is a laser processing. In this case, it is advantageous that laser processing enables very precise and fine processing even in the depth of the layers.

In a further possible embodiment, one of the metal layers arranged on the pressing side of the base structure, may be a nickel layer or nickel-containing metal layer. The first and/or the second ceramic layer may be arranged on the pressing side above. A metal layer, a nickel layer or nickel-containing metal layer may additionally be arranged between the first and second ceramic layers. These metal layers enable the attachment of further layers in their function as a connecting layer.

In another possible embodiment, the structured surface of the base structure is at least partially produced in a 3-dimensional relief layer structure using an additive manufacturing process. Additive manufacturing processes can be, for example, inkjet printing, 3-D printing, sintering, lithography, lacquering, printing with UV-curing ink or acrylate. Such manufacturing processes enable small batch sizes and the realization of individual structural requirements of the furniture industry.

Alternatively, the structured surface of the base structure can be produced at least partially in a 3-dimensional form using an electrochemical, mechanical or laser processing process. For example, masking and etching processes known from the prior art, or electrochemical chromium plating processes can be used in this regard. Tried and tested processes can thereby be used together with the improvements on the pressing tool, thus increasing the variety of applications.

The second ceramic layer can optionally fully cover the structured surface of the base structure (10) and have a thickness of preferably 0.001 mm to 2 mm, wherein the first ceramic layer has a different thickness, but also preferably in the range of 0.001 mm to 2 mm. The differences in layer thickness result in a different structure and thus in different degrees of gloss of the first and second ceramic layers, wherein in particular the two ceramic layers can be made of the same ceramic material. In this regard, the different layer thicknesses can be used to achieve optical effects.

Alternatively, the ceramic material of the two ceramic layers may differ to obtain the different degrees of gloss of the first ceramic layer and the second ceramic layer, wherein in particular the thickness of the second ceramic layer may be equal to the thickness of the first ceramic layer. The use of different ceramic layers further increases the optical and combinatorial possibilities for achieving a true-to-nature imitation of natural materials.

For example, the following materials may be used as the ceramic material of the ceramic layers: Hafnium diboride, molybdenum diboride, tantalum diboride, titanium diboride, tungsten diboride, vanadium diboride, zirconium diboride or mixtures of these ceramic materials. The advantage of these materials is their resistance and hardness, which leads to improved pressing properties of the pressing tool.

An embodiment of the pressing tool according to the present disclosure can be produced, for example, by
   providing a support structure for a base structure,
   applying at least two base structure layers onto the support structure to build the base structure
   producing a structured surface on the support structure
   applying a first ceramic layer onto the surface of the base structure, and
   applying a second ceramic layer onto the structured surface and/or onto the applied first ceramic layer.

This makes it possible to produce a particularly resistant surface which can nevertheless be configured in such a way that it realistically mimics a natural look, in particular a wood look.

In a further advantageous advancement, the method may comprise the following steps:
   applying a partial mask onto the structured surface of the base structure,
   applying a first ceramic layer onto the structured surface provided with the mask,
   removing the mask so that the first ceramic layer is only partially arranged on the structured surface, and
   full-surface application of the second ceramic layer onto the partially applied first ceramic layer and the structured surface of the base structure.

The advantage of this is that individual areas on the pressing tool can have different optical properties, such as degrees of gloss, and yet production is simple and masking processes are tried and tested.

In an alternative embodiment, the method may comprise the following steps:
   full-surface application of the first ceramic layer onto the structured surface of the base structure.
   applying a partial mask onto the first ceramic layer,
   applying the second ceramic layer onto the first ceramic layer provided with the mask In this regard, it is advantageous if individual areas on the pressing tool can have different optical properties, such as degrees of gloss, and also contribute to the overall relief structure of the pressing tool.

Optionally, the mask can be removed so that the first ceramic layer is only partially arranged on the structured surface.

In a further optional method embodiment, a metal layer, a chromium layer, a nickel layer or nickel-containing metal layer can be applied as a mask.

Advantageously, the mask can remain on the pressing tool as a functional layer.

The process according may be supplemented by the step of a post-treatment, in which the corresponding applied ceramic layer or mask is treated so as to obtain a predetermined degree of gloss of the corresponding ceramic layer or mask.

In one embodiment, the application of the ceramic layers may be performed by means of a surface magnetron sputter coating system, wherein the partial production of the ceramic layer is performed by suitably controlling the surface magnetron sputter coating system. This ensures a coherent application of the ceramic layers whose layer thickness can be precisely controlled or regulated.

In this context, the method can be advanced in such a way that the following steps are additionally performed:
   transport of the press plate on a transport system
   opening of a first lock to the processing chamber
   transport of the press plate into the processing chamber of the surface magnetron sputter coating system
   closing of the first lock
   application of a vacuum in the processing chamber by means of a vacuum pump
   application of one or more ceramic layers by means of a magnetron
   opening of the first lock to the processing chamber
   transporting the press plate through the first lock out of the processing chamber of the surface magnetron sputter coating system.

By this advantageous further advancement, a cost-effective production of the pressing tool can be realized.

The method may comprise the following additional steps:
   transport of the press plate through a vacuum prechamber with a prechamber lock, which vacuum prechamber is located upstream of the processing chamber as seen in the direction of transport, wherein the vacuum prechamber is brought by means of a vacuum pump to a pressure level which is between atmospheric pressure and a processing pressure during the application of a ceramic layer in the processing chamber, wherein this processing pressure is in particular below $10^{-5}$ mbar, preferably at $10^{-8}$ mbar.

This advantageous process improvement ensures energy-efficient coating.

The method can alternatively comprise the additional steps:
   transport of the press plate through a vacuum prechamber with a prechamber lock, which vacuum prechamber is upstream of the processing chamber as seen in the transport direction, wherein the vacuum prechamber is brought by means of a vacuum pump to a pressure level which is between atmospheric pressure and a processing pressure, during the application of a ceramic layer in the processing chamber, wherein this processing pressure is in particular below $10^{-5}$ mbar, preferably at $10^{-8}$ mbar.
   transport of the press plate through a vacuum postchamber with a postchamber lock, which vacuum postchamber is located downstream of the processing chamber as seen in the transport direction, wherein the vacuum postchamber is brought by means of a vacuum pump to a pressure level which is between the atmospheric pressure and the processing pressure. Advantageously, optimized processing is thus possible using small amounts of energy for vacuum generation.

A further aspect of the present disclosure is the use of a pressing tool according to the present disclosure for the production of material boards, in particular material boards for the furniture industry or for laminate flooring panels.

Advantageously, the pressing tool according to the present disclosure can be used to produce large quantities of material boards, in particular material boards for the furniture industry or for laminate flooring panels, with low wear.

BRIEF DESCRIPTION OF THE DRAWINGS

Exemplary embodiments are shown in the enclosed schematic figures by way of example. These show.

DETAILED DESCRIPTION

Figures 1, 2:
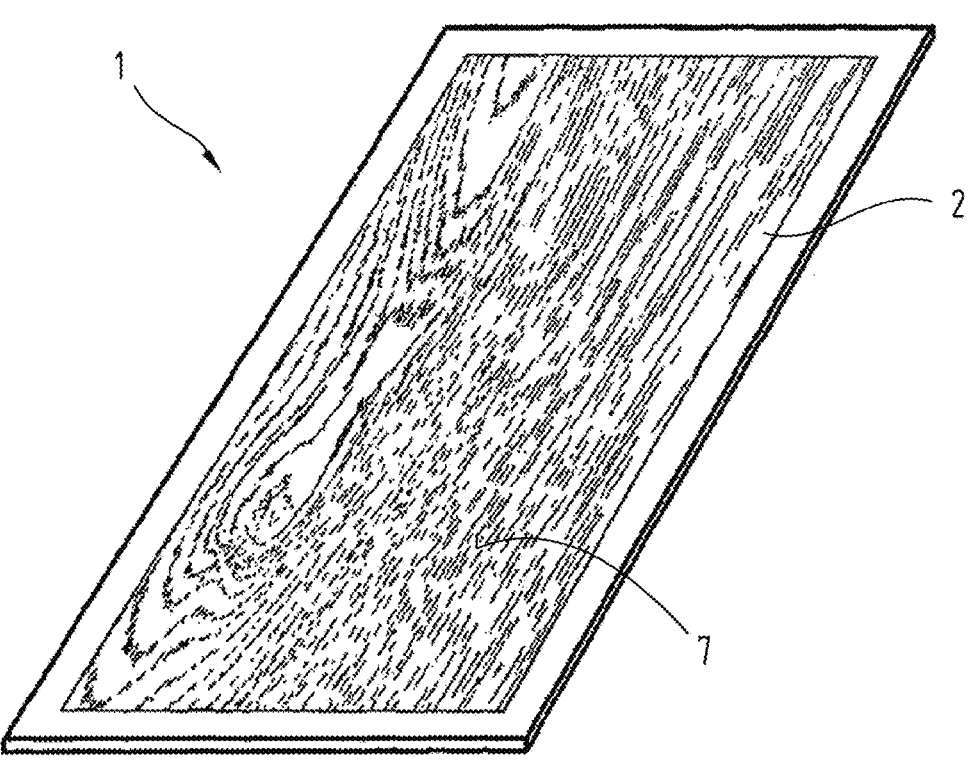
FIG. 1 a press plate with a pressing surface in a perspective representation, FIG. 2 a cutout from a lateral view of the press plate in a sectional representation, FIGS. 3A, 3B and 3C intermediate states of the press plate during its production, FIG. 4 a cutout from a lateral view of the press plate in a sectional representation of an alternative embodiment, FIG. 5 a cutout from a lateral view of the press plate in a sectional representation of a further alternative embodiment, FIG. 6 a cutout from a lateral view of the press plate with a laminate during a pressing process in a closed press in a sectional representation, FIG. 7 lateral view surface magnetron sputter coating system in a sectional representation.

FIG. 1 shows a pressing tool, which is configured as a press plate 1 in the case of the present embodiment, in a perspective view. The press plate 1 comprises a pressing surface 2. The pressing side 3 is that side of the press plate 1 which faces the laminate during a pressing process in a press.

FIG. 2 shows a cutout from a lateral view of the press plate 1 in a sectional view.

The pressing surface 2 may be configured to be smooth, but in the case of the present embodiment, it comprises a structure of the elevations 4 and depressions 3.

The structure of the pressing surface 2 is, in particular, assigned to a natural material that is wood in the case of the present exemplary embodiment.

The pressing surface 2 is arranged on a plurality of base structure layers 15 of the base structure 10. In addition to the base structure layers 15, the base structure 10 also includes the support structure.

In this exemplary embodiment, the first ceramic layer 11 is partially arranged on the base structure 10 and the second ceramic layer 12 covers the surface 31 of the base structure 10 and the first ceramic layer 11 over the entire surface.

By the press plate 1, a workpiece, e.g., a press plate, for example a laminate, can be produced by pressing. After pressing, the workpiece has a structured surface corresponding to the structure of the pressing surface 2.

Figure 3A:
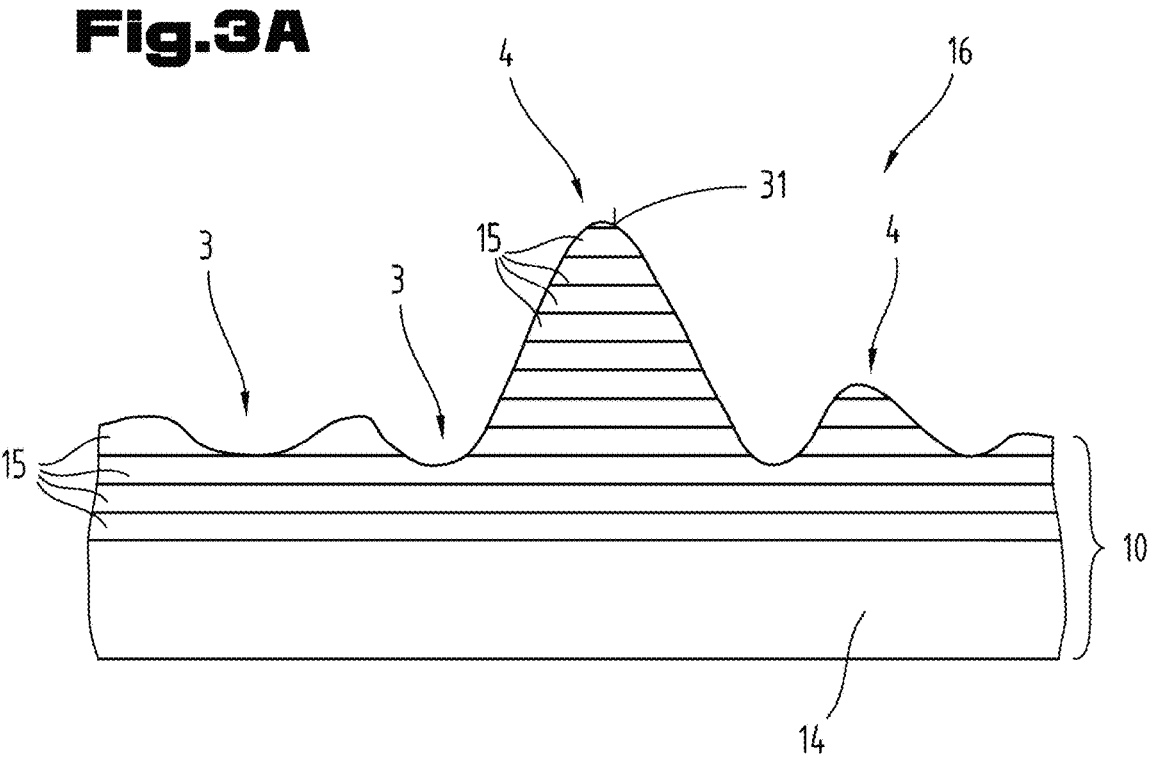

In the case of the present exemplary embodiment, the press plate 1 comprises a base structure 10, shown in FIG. 3A, with a structured surface 31 assigned to the structure of the pressing surface 2.

In the case of the present exemplary embodiment, the press plate 1 comprises a partial ceramic layer 11 arranged on the structured surface 31 of the base structure 10 and a full-surface ceramic layer 12 arranged on the partial ceramic layer 11 to form the pressing surface 2.

In the case of the present exemplary embodiment, the base structure 10 is made of metal.

In the case of the present exemplary embodiment, the press plate 1 comprises a base carrier, in particular a support structure 14, for example of metal, on which the base structure 10 is arranged.

In the case of the present exemplary embodiment, the base structure 10 comprises multiple base structure layers 15 located on top of one another. The base structure layers 15 are preferably made of nickel and are at least partially configured to be partial and form the relief layer structure 16 together with the ceramic layers 11,12.

The base structure 10 may be produced, for example by applying a mask not shown in more detail at least once to a base structure layer 15 dependent on image data assigned to the structure of the structured pressing surface 2, in order to cover areas, and subsequently applying a further base structure layer 15 onto the areas not covered by said mask. This is repeated until the base structure 10 has been formed. The base structure 10 is produced in particular dependent on image data assigned to the structure of the pressing surface 2, i.e. dependent on the protrusions 4 and recesses 5, by applying the masks and the base structure layers 15, dependent on this image data, subsequently for example by means of a galvanic or chemical method.

Figure 3B:
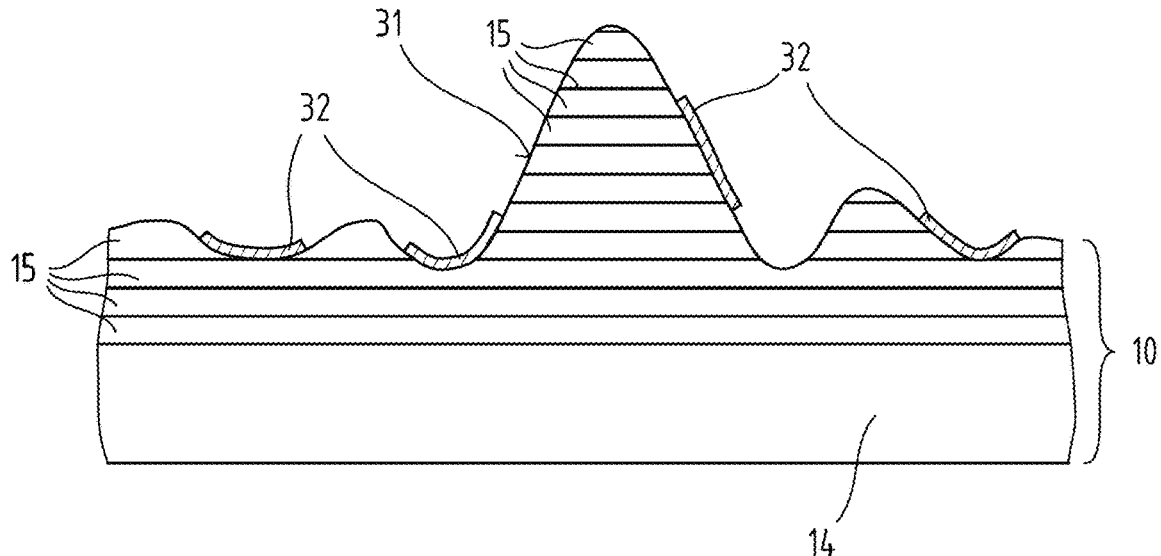

Subsequently, in the case of the present exemplary embodiment, a mask 32 shown in FIG. 3B is applied to the structured surface 31 of the base structure 10 to partially cover the structured surface 31 of the base structure 10.

Figure 3C:
Figure 3C:
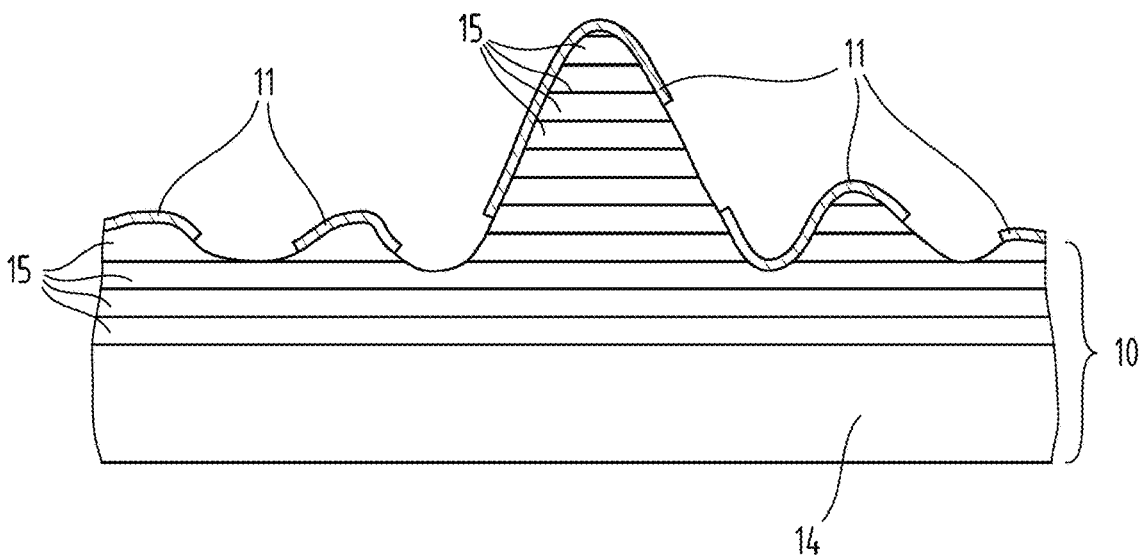

Subsequently, in the case of the present embodiment, a ceramic layer is applied to the areas of the structured surface 31 of the base structure 10 not covered by the mask 32 by means of a surface magnetron sputter coating system 33. Subsequently, the mask 32 is removed so that only the areas of the structured surface 31 of the base structure 10 not covered by the mask 32 are covered with the ceramic layer, whereby the partial ceramic layer 11 is created, see FIG. 3c. By suitably controlling the surface magnetron sputter coating system 33, the partial ceramic layer 11 is provided with a predetermined thickness, whereby it obtains a predetermined degree of gloss.

Subsequently, in the case of the present exemplary embodiment, the full-surface ceramic layer 12 is applied to the partial ceramic layer 11 by means of the surface magnetron sputter coating system 33. In order to adjust the degree of gloss of the full-surface ceramic layer 12, it is provided with a predetermined thickness controlled by the surface magnetron sputter coating system 33.

In the case of the present exemplary embodiment, the two ceramic layers 11, 12 are made of the same ceramic material, for example, hafnium diboride, molybdenum diboride, tantalum diboride, titanium diboride, tungsten diboride, vanadium diboride, zirconium diboride or mixtures of these ceramic materials.

In order for the ceramic layers 11, 12 to have different degrees of gloss, the thicknesses of the two ceramic layers differ in the case of the present exemplary embodiment. In particular, the full-surface ceramic layer 12 is thinner than the partial ceramic layer 11. In particular, the two ceramic layers 11, 12 consist of the same ceramic material.

The thicknesses of the two ceramic layers 11, 12 are preferably in the range between 1 μm and 2 μm.

The ceramic layers preferably have a Vickers hardness of at least 2000 HV.

To set different degrees of gloss of the ceramic layers 11, 12, these may also have different ceramic materials.

To allow for the degrees of gloss of the ceramic layers 11, 12 to be set, these can also be subjected to a subsequent treatment, for example polishing or a laser treatment.

It is also possible to first provide the structured surface 31 of the base structure 10 with the full-surface ceramic layer 12 and to apply the partial ceramic layer 11 onto the latter.

It is also possible to produce the partial ceramic layer 11 by suitably controlling the surface magnetron sputter coating system 33.

Figure 4:
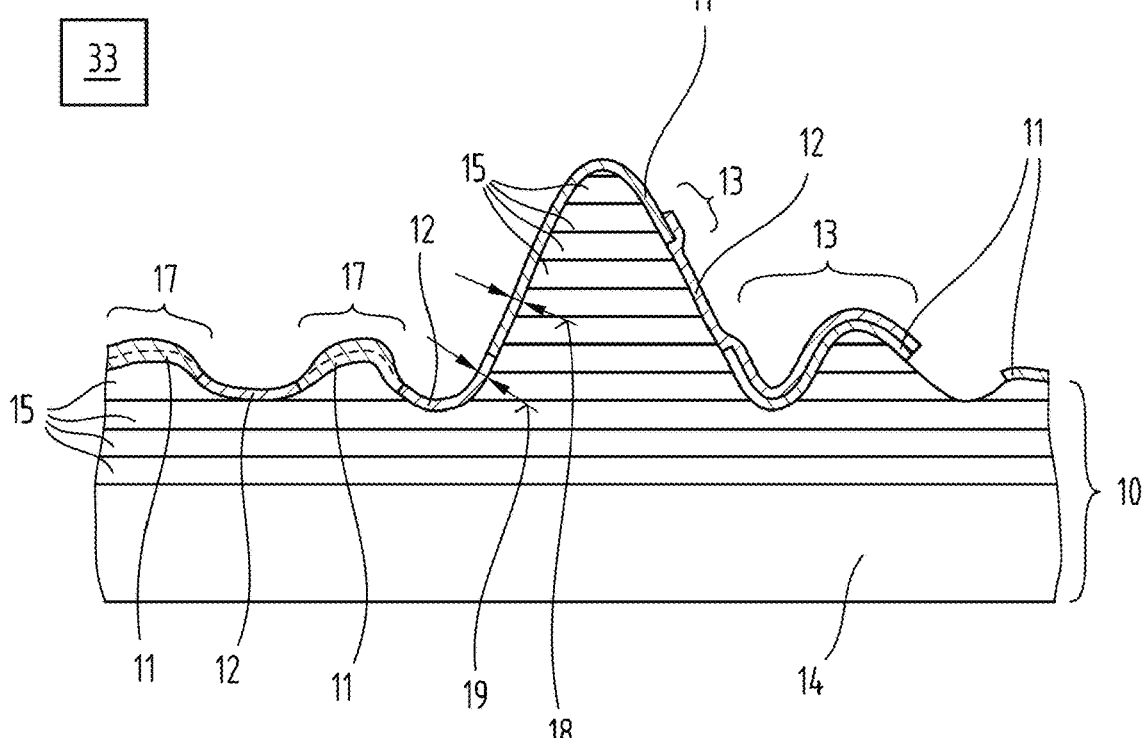

FIG. 4 shows a cutout from a lateral view of the press plate in a sectional representation of an alternative embodiment. The first ceramic layer 11 and the second ceramic layer 12 are each applied only partially on the structured surface 31 of the base structure 10. As in the other exemplary embodiments the base structure layers 15 can be metallic, in particular made of nickel, but also made of other materials such as plastic or ceramic. The base structure layers 15 can be applied using known additive or ablative manufacturing processes.

In a further advantageous further advancement of this exemplary embodiment, the second ceramic layer 12 may be arranged at least partially on the first ceramic layer 11.

Also, the first ceramic layer 11 or the second ceramic layer 12 can be processed by means of a laser at least in a laser processing area 17. The processing by a laser can serve in particular to influence the degree of gloss, the reflection properties, the mattness or the structure of the ceramic layer and thus to transfer these structural properties to the laminate to be produced as a positive.

In a further embodiment according to FIG. 4, the second ceramic layer 12 can cover the structured surface 31 of the base structure 10 over the entire surface and have a second thickness 19, wherein the first ceramic layer 11 has a first thickness 18. In this regard, the first thickness 18 and the second thickness 19 may have different layer thicknesses in order to obtain the different degrees of gloss of the first and the second ceramic layers 11, 12, wherein in particular the two ceramic layers 11, 12 may consist of the same ceramic material.

The ceramic material of the ceramic layers 11, 12 in the various exemplary embodiments disclosed herein may for example consist of hafnium diboride, molybdenum diboride, tantalum diboride, titanium diboride, tungsten diboride, vanadium diboride, zirconium diboride or mixtures of these ceramic materials.

In a further exemplary embodiment according to FIG. 4, the ceramic material of the two ceramic layers 11, 12 may differ to obtain different degrees of gloss of the first ceramic layer 11 and the second ceramic layer 12, wherein in particular the thickness 19 of the second ceramic layer 12 is equal to the thickness 18 of the first ceramic layer 11.

The thicknesses of the two ceramic layers 11, 12 are preferably in the range between 1 μm and 2 mm.

In overlapping areas 13, the two ceramic layers can be arranged at least partially on top of each other.

Figure 5:
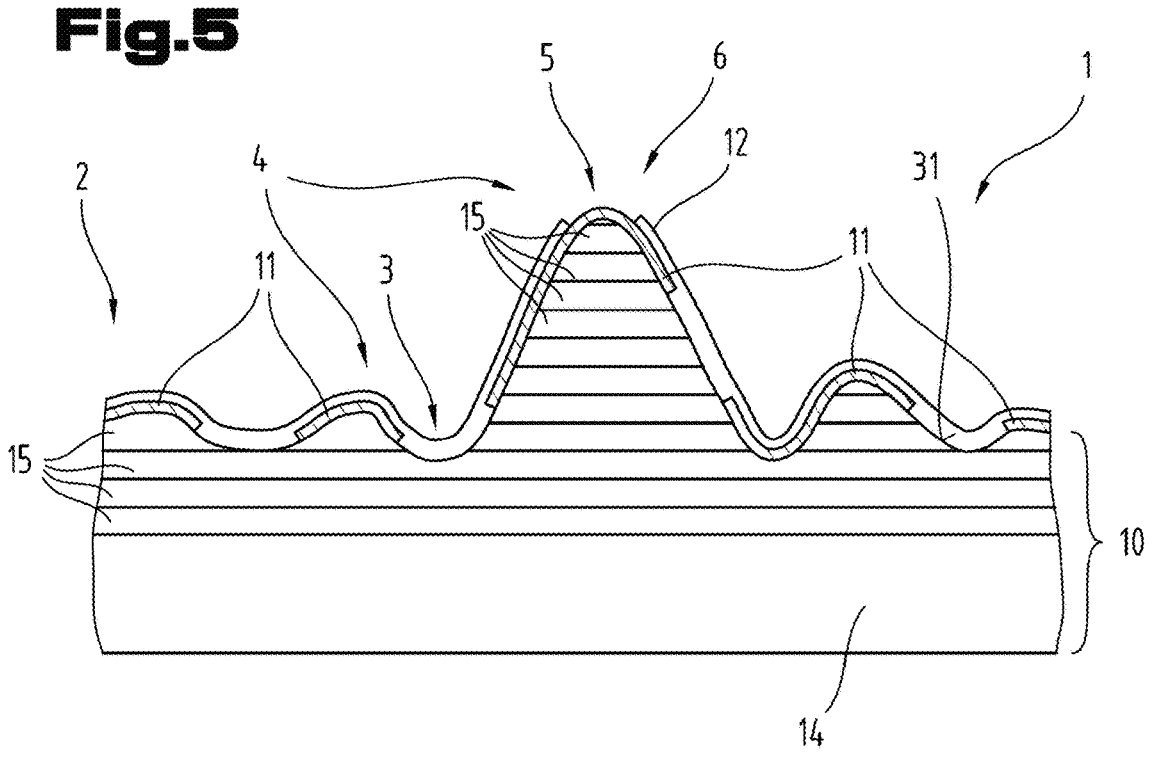

FIG. 5 shows a cutout from a lateral view of the press plate in a sectional representation of a further alternative embodiment in which the two ceramic layers 11,12 are arranged at least partially one above the other. The second ceramic layer 12 arranged on the pressing side 7 of the pressing tool has at least one clearance 5 which allows the first ceramic layer to come to the surface and/or opens a cutout 6 like a window to the first ceramic layer. In this regard, the production can be carried out by using masks 32 during the application of the ceramic layer 12 and subsequent removal of the mask 32, or by removing a part of the second ceramic layer 12 by means of a chemical process, for example by using a sodium hydroxide solution containing hydrogen peroxide.

In all other respects, the base structure is based on the exemplary embodiments of FIGS. 2 and 3 or 4.

Figure 6:
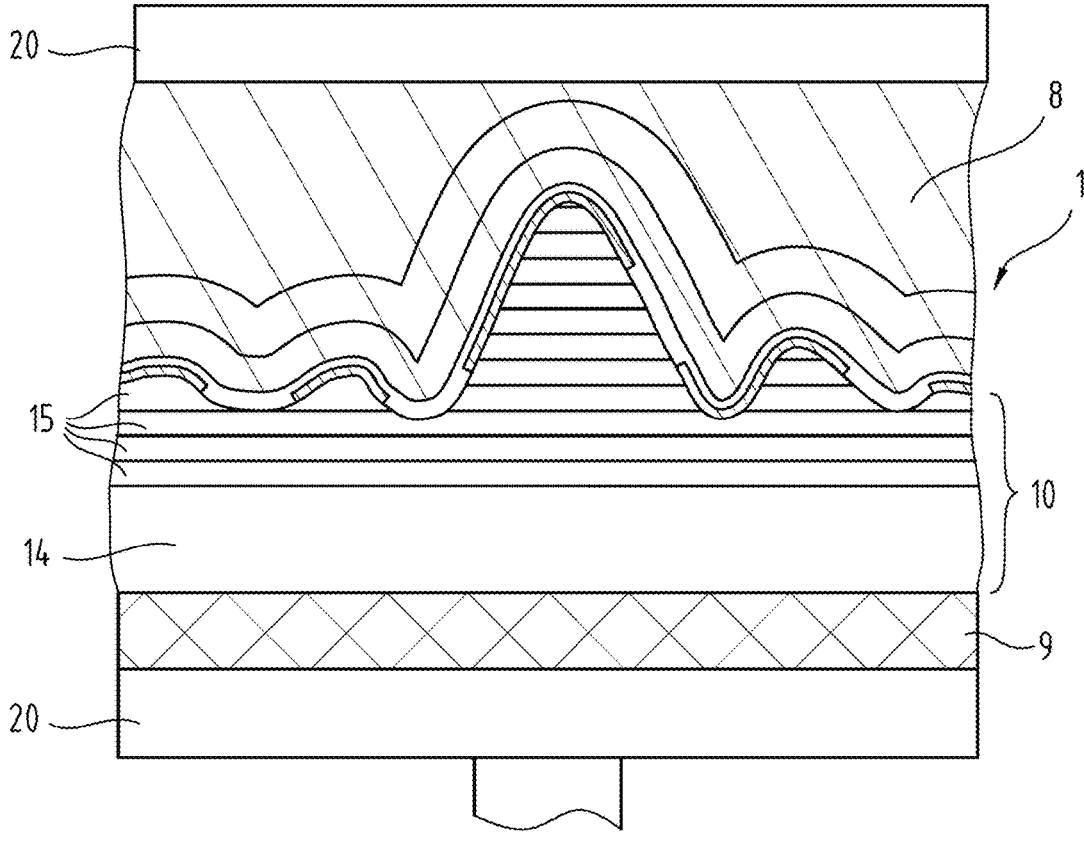

FIG. 6 shows a cutout from a lateral view of the press plate with a laminate during a pressing operation in a closed press in a sectional representation. The pressing tool, in particular of a press plate 1, is placed on a press pad 9 in a press 20, for example a short-cycle press. During the depicted pressing operation with closed parts of the press 20, a laminate 8, in particular a material board for the furniture industry or flooring panels, is fused under the action of temperature and pressure and the negative shape of the pressing surface 2 with its recesses 3 and protrusions 4 is formed as a positive in the laminate 8.

Figure 7:
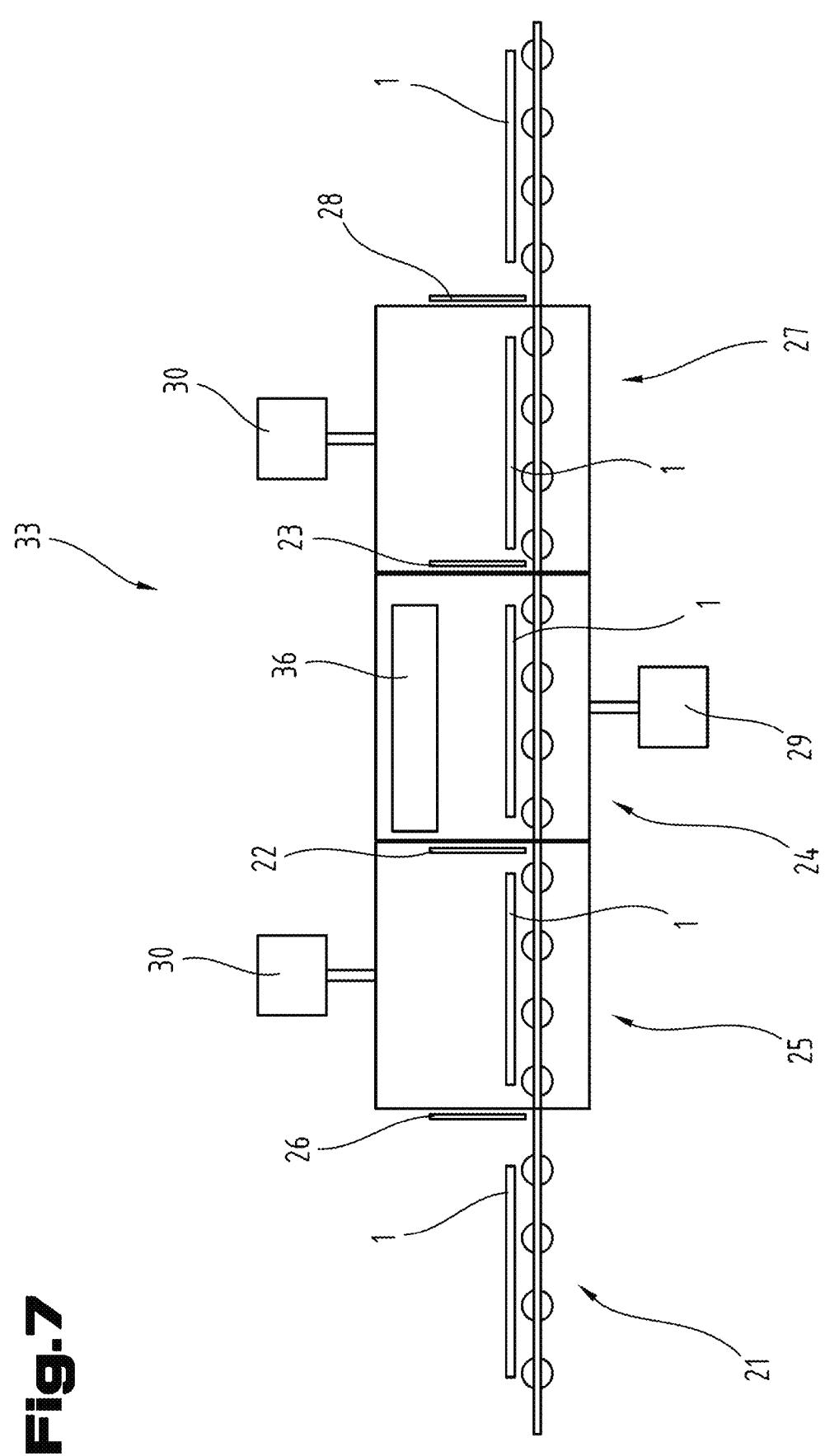

FIG. 7 shows a lateral view of a surface magnetron sputter coating system 33 in a sectional representation.

In this exemplary embodiment, a surface magnetron sputter coating system 33 is shown which has a multi-chamber system. Alternatively, however, a single-chamber system with only one processing chamber 24 without further chambers is also possible.

A pressing tool, in particular a press plate 1, is introduced into a vacuum prechamber 25 by means of a transport system 21 with the prechamber lock 26 being open. The prechamber lock 26 is closed and the vacuum pump 30 reduces the pressure in the vacuum prechamber 25. For example, to a pressure below $10^-2$ mbar, preferably at $10^-5$ mbar. Meanwhile, the lock 22 is closed and a processing pressure prevails in the processing chamber. Subsequently, lock 22 is opened and the pressure adjusts between processing chamber 24 and vacuum prechamber 25. This saves energy and cycle time compared to a single-chamber system. The pressing tool is conveyed into the processing chamber 24. The locks 22 and 23 are closed, and a vacuum is applied in the processing chamber by the vacuum pump 29. In this regard, the processing pressure is below $10^-5$ mbar, preferably at $10^-8$ mbar. After completion of the processing operation, the pressing tool is conveyed through the open lock 23 into the vacuum chamber. There, a pressure level comparable to that of the vacuum prechamber prevails before the postchamber lock is opened. The vacuum prechamber and the vacuum postchamber can be connected to each other via vacuum lines with valves in order to exchange vacuum between the vacuum prechamber and the vacuum postchamber during a cycle change in a continuous operation of the surface magnetron sputter coating system 33, thus saving energy for the operation of the vacuum pumps 30. It is possible to use other PVD coating systems, PVD sputtering systems, magnetron sputtering systems or similar systems instead of a surface magnetron sputter coating system for the various exemplary embodiments disclosed herein.

The invention claimed is:

1. A pressing tool for producing a workpiece, comprising:
   a pressing surface,
   a base structure, which comprises a surface, and
   at least two ceramic layers which are arranged on the surface and form the pressing surface, of which a first ceramic layer has a first degree of gloss and a second ceramic layer has a second degree of gloss, which differs from the first degree of gloss of the first ceramic layer.

2. The pressing tool according to claim 1, wherein the pressing tool is a press plate for producing a material board.

3. The pressing tool according to claim 1, wherein the base structure of the pressing tool comprises a support structure made of stainless steel.

4. The pressing tool according to claim 3, wherein the pressing surface has a structure of protrusions and recesses, and the base structure has a structured surface provided on the support structure, wherein at least two base structure layers made of metal are provided on the support structure, wherein the base structure layers are arranged at least partially one above the other and form the structured surface of the base structure.

5. The pressing tool according to claim 4, wherein at least one of the first and second ceramic layers is applied only partially to the structured surface of the base structure and thus forms a relief layer structure of the structured surface.

6. The pressing tool according to claim 4, wherein the first ceramic layer and the second ceramic layer are each applied only partially on the structured surface of the base structure.

7. The pressing tool according to claim 6, wherein the second ceramic layer is arranged at least partially on the first ceramic layer.

8. The pressing tool according to claim 7, wherein the first ceramic layer or the second ceramic layer is processed by means of a laser at least in a laser processing area.

9. The pressing tool according to claim 7, wherein a clearance is provided in the second ceramic layer, which, viewed in the direction of the base structure, extends to the first ceramic layer.

10. The pressing tool according to claim 9, wherein the clearance is a cutout produced by subsequent processing of the applied second ceramic layer.

11. The pressing tool according to claim 10, wherein the subsequent processing is a laser processing.

12. The pressing tool according to claim 4, wherein at least one of the base structure layers is arranged on a pressing side of the base structure, and is a nickel layer or nickel-containing metal layer.

13. The pressing tool according to claim 4, wherein the structured surface of the base structure is at least partially produced in a 3-dimensional relief layer structure using an additive manufacturing process.

14. The pressing tool according to claim 4, wherein the structured surface of the base structure is produced at least partially in a 3-dimensional form using an electrochemical, mechanical or laser processing process.

15. The pressing tool according to claim 4, wherein the second ceramic layer covers the structured surface of the base structure over the entire surface and has a second thickness, wherein the first ceramic layer has a first thickness, wherein the first thickness and the second thickness have different layer thicknesses in order to obtain the different degrees of gloss of the first and the second ceramic layers, wherein the two ceramic layers consist of the same ceramic material.

16. The pressing tool according to claim 1, wherein the ceramic material of the two ceramic layers differs to obtain different degrees of gloss of the first ceramic layer and the second ceramic layer, and the thickness of the second ceramic layer is equal to the thickness of the first ceramic layer.

17. The pressing tool according to claim 1, wherein the ceramic material of the ceramic layers is selected from the group consisting of hafnium diboride, molybdenum diboride, tantalum diboride, titanium diboride, tungsten diboride, vanadium diboride, zirconium diboride and mixtures thereof.

18. A method for producing a pressing tool, comprising the following method steps:

providing a support structure for a base structure, applying at least two base structure layers onto the support structure to build the base structure, producing a structured surface on the support structure, applying a first ceramic layer having a first degree of gloss onto the structured surface of the base structure, and applying a second ceramic layer having a second degree of gloss onto the structured surface and/or onto the applied first ceramic layer, wherein the second degree of gloss differs from the first degree of gloss.

19. The method according to claim 18, further comprising:

applying a partial mask onto the structured surface of the base structure, wherein the step of applying the first ceramic layer onto the structured surface is performed after the step of applying the partial mask onto the structural surface, removing the partial mask so that the first ceramic layer only partially covers the structured surface, and full-surface application of the second ceramic layer onto the first ceramic layer and the structured surface of the base structure.

20. The method according to claim 18, further comprising:

full-surface application of the first ceramic layer onto the structured surface of the base structure, applying a partial mask onto the first ceramic layer, wherein the step of applying the second ceramic layer onto the first ceramic layer is performed after applying the partial mask.

* * * * *